United States Patent
Ko et al.

(10) Patent No.: US 8,264,260 B2
(45) Date of Patent: Sep. 11, 2012

(54) DELAY LOCKED LOOP AND METHOD OF DRIVING DELAY LOCKED LOOP

(75) Inventors: Jae-hong Ko, Seoul (KR); Ho-Hak Rho, Seoul (KR); Paul Kim, Hwasung (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 230 days.

(21) Appl. No.: 12/722,768

(22) Filed: Mar. 12, 2010

(65) Prior Publication Data

US 2010/0264968 A1 Oct. 21, 2010

(30) Foreign Application Priority Data

Apr. 21, 2009 (KR) .................. 10-2009-0034714

(51) Int. Cl.
*H03L 7/06* (2006.01)
(52) U.S. Cl. ........................ 327/158; 327/149
(58) Field of Classification Search .......... 327/149, 327/158
See application file for complete search history.

(56) References Cited

U.S. PATENT DOCUMENTS

| | | | |
|---|---|---|---|
| 3,906,379 A * | 9/1975 | Tuhro | 327/37 |
| 6,940,325 B2 | 9/2005 | Lee | |
| 7,027,548 B1 | 4/2006 | Palusa et al. | |
| 7,161,398 B2 | 1/2007 | Park et al. | |
| 7,227,809 B2 * | 6/2007 | Kwak | 365/189.15 |
| 7,957,464 B2 * | 6/2011 | Yamazaki | 375/239 |
| 2002/0024366 A1 | 2/2002 | Ooishi et al. | |
| 2006/0028256 A1 * | 2/2006 | Nam et al. | 327/172 |
| 2009/0140785 A1 * | 6/2009 | Choi | 327/175 |
| 2009/0171602 A1 * | 7/2009 | Hong | 702/65 |
| 2009/0251226 A1 * | 10/2009 | Kathuria et al. | 331/1 R |
| 2010/0237917 A1 * | 9/2010 | Monma | 327/158 |
| 2010/0264968 A1 * | 10/2010 | Ko et al. | 327/158 |
| 2011/0013689 A1 * | 1/2011 | Yamazaki | 375/238 |
| 2011/0298504 A1 * | 12/2011 | Becker et al. | 327/149 |

FOREIGN PATENT DOCUMENTS

KR  1020040091975 A  11/2004
KR  1020060079581 A  7/2006

* cited by examiner

*Primary Examiner* — Lincoln Donovan
*Assistant Examiner* — Adam Houston
(74) *Attorney, Agent, or Firm* — Volentine & Whitt, PLLC (57) ABSTRACT

Provided are a delay locked loop (DLL) having a pulse width detection circuit and a method of driving the DLL. The DLL includes a pulse width detection circuit and a delay circuit. The pulse width detection circuit receives a reference clock signal, detects a pulse width of the reference clock signal, and outputs the detection result as a pulse width detection result signal. The delay circuit receives and delays the reference clock signal, and outputs the delayed reference clock signal as an output clock signal. The delay circuit receives the pulse width detection result signal from the pulse width detection circuit, and controls a time delay in the reference clock signal in response to the pulse width detection result signal.

8 Claims, 10 Drawing Sheets

DELAY LOCKED LOOP AND METHOD OF DRIVING DELAY LOCKED LOOP

CROSS-REFERENCE TO RELATED APPLICATIONS

A claim of priority is made to Korean Patent Application No. 10-2009-0034714, filed on Apr. 21, 2009, in the Korean Intellectual Property Office, the subject matter of which is hereby incorporated by reference.

BACKGROUND

The present inventive concept relates to a delay locked loop (DLL), and more particularly, to a DLL having a pulse width detection circuit and a method of driving the DLL.

In general, conventional DLLs incorporate multiple voltage-controlled oscillators (VCOs), where a frequency domain is divided into several parts according to frequency range, and using a control signal. However, DLLs generally have no frequency margin since the range of frequencies is large. For example, for a DLL having a frequency domain of 92 MHz to 200 MHz, a minimum time delay in the VCOs must be decreased in order to secure the margin of 200 MHz. In this case, however, a maximum time delay in the VCOs is decreased, thus reducing the margin of 92 MHz. If the maximum time delay is increased in order to secure the margin of 92 MHz, the minimum time delay increases, thus reducing the margin of 200 MHz. That is, although DLLs have a structure in which VCOs are used by dividing a frequency domain into several parts, the high-frequency margin and the low-frequency margin both cannot be satisfied in each of the VCOs. Also, since frequency domains having large ranges are used, gains inevitably increase, and thus the VCOs are sensitive to changes in a control voltage Vctrl.

SUMMARY

Embodiments to the inventive concept provide a delay locked loop (DLL), and a method of driving the DLL, that detects the pulse width of a clock signal, and adjusts a time delay in a delay circuit according to the detected pulse width.

According to an aspect of the inventive concept, there is provided a DLL including a pulse width detection circuit and a delay circuit. The pulse width detection circuit receives a reference clock signal, detects a pulse width of the reference clock signal, and outputs the detection result as a pulse width detection result signal. The delay circuit receives and delays the reference clock signal, and outputs the delayed reference clock signal as an output clock signal. The delay circuit receives the pulse width detection result signal from the pulse width detection circuit, and controls a time delay in the reference clock signal in response to the pulse width detection result signal.

The pulse width detection circuit may sample the reference clock signal multiple times using multiple sampling clock signals having different time delays, and output at least one of the sampling results as the pulse width detection result signal.

The pulse width detection circuit may include at least one sampling unit receiving the reference clock signal and multiple sampling clock signals, sampling the reference clock signal according to the respective sampling clock signals, and outputting the sampling results. The sampling clock signals received by the at least one sampling unit may be obtained by delaying the reference clock signal according to different time delays. The pulse width detection circuit may output at least one of the output sampling results of the at least one sampling unit as the pulse width detection result signal.

The delay circuit may include first through mth delayers that are connected in series, where m is a natural number equal to or greater than 2. The first delayer may receive the reference clock signal and the pulse width detection result signal, determine a first time delay in response to the pulse width detection result signal, delay the reference clock signal for the first time delay, and output the delayed result. The $n^{th}$ delayer may receive an output of the $n-1^{th}$ delayer and the pulse width detection result signal, determine an $n^{th}$ time delay in response to the pulse width detection result signal, delay the output of the $n-1^{th}$ delayer for the nth time delay, and output the delayed result, where n is a natural number that is equal to or greater than 2 and that is less than or equal to m.

Each of the first through mth delayers may include a first delay cell receiving the pulse width detection result signal, a time delay in the first delay cell being controlled in response to the pulse width detection result signal. The first delay cell may include a first inverter inverting a received signal and outputting the inversion result to a first node; a capacitor unit connected between the first node and a ground voltage source, and having a capacitance controlled according to the pulse width detection result signal; and a second inverter inverting a signal received from the first node and outputting the inversion result.

The DLL may further include a control voltage generation unit receiving the reference clock signal, receiving a feedback clock signal from the delay circuit, and generating a control voltage signal according to the reference clock signal and the feedback clock signal. Each of the first through mth delayers may further include a second delay cell receiving the control voltage signal from the control voltage generation unit, a time delay in the second delay cell being controlled in response to the control voltage signal.

The time delay in the first delay cell may be longer than the time delay in the second delay cell.

The delay locked loop may further include a bias circuit. The bias circuit may generate a bias signal according to process, voltage and temperature (PVT) variations, and supply the bias signal to the pulse width detection circuit and the delay circuit.

According to another aspect of the inventive concept, there is provided a pulse width detecting circuit of a DLL, including multiple sampling units and multiple delay cells. The sampling units receive a reference clock signal and multiple sampling clock signals, sample the reference clock signal multiple times using the sampling clock signals, and output the sampling results. The delay cells obtain the sampling clock signals by respectively delaying the reference clock signal, and providing the sampling clock signals to the sampling units, where the sampling clock signals have different time delays. The pulse width detecting circuit outputs at least one of the output sampling results of the sampling units as a pulse width detection result signal indicating a pulse width of the reference clock signal.

According to another aspect of the inventive concept, there is provided a method of driving a DLL. The method includes receiving a reference clock signal; detecting pulse width of the reference clock signal, and outputting a pulse width detection result signal; and delaying the reference clock signal and outputting the delayed reference clock signal. The delaying of the reference clock signal and the outputting of the delayed reference clock signal includes receiving the pulse width detection result signal and controlling a time delay for the reference clock signal in response to the pulse width detection result signal.

BRIEF DESCRIPTION OF THE DRAWINGS

Exemplary embodiments of the inventive concept will be described with reference to the attached drawings, in which.

DETAILED DESCRIPTION OF THE EMBODIMENTS

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Throughout the drawings and written description, like reference numerals will be used to refer to like or similar elements.

Figure 1:
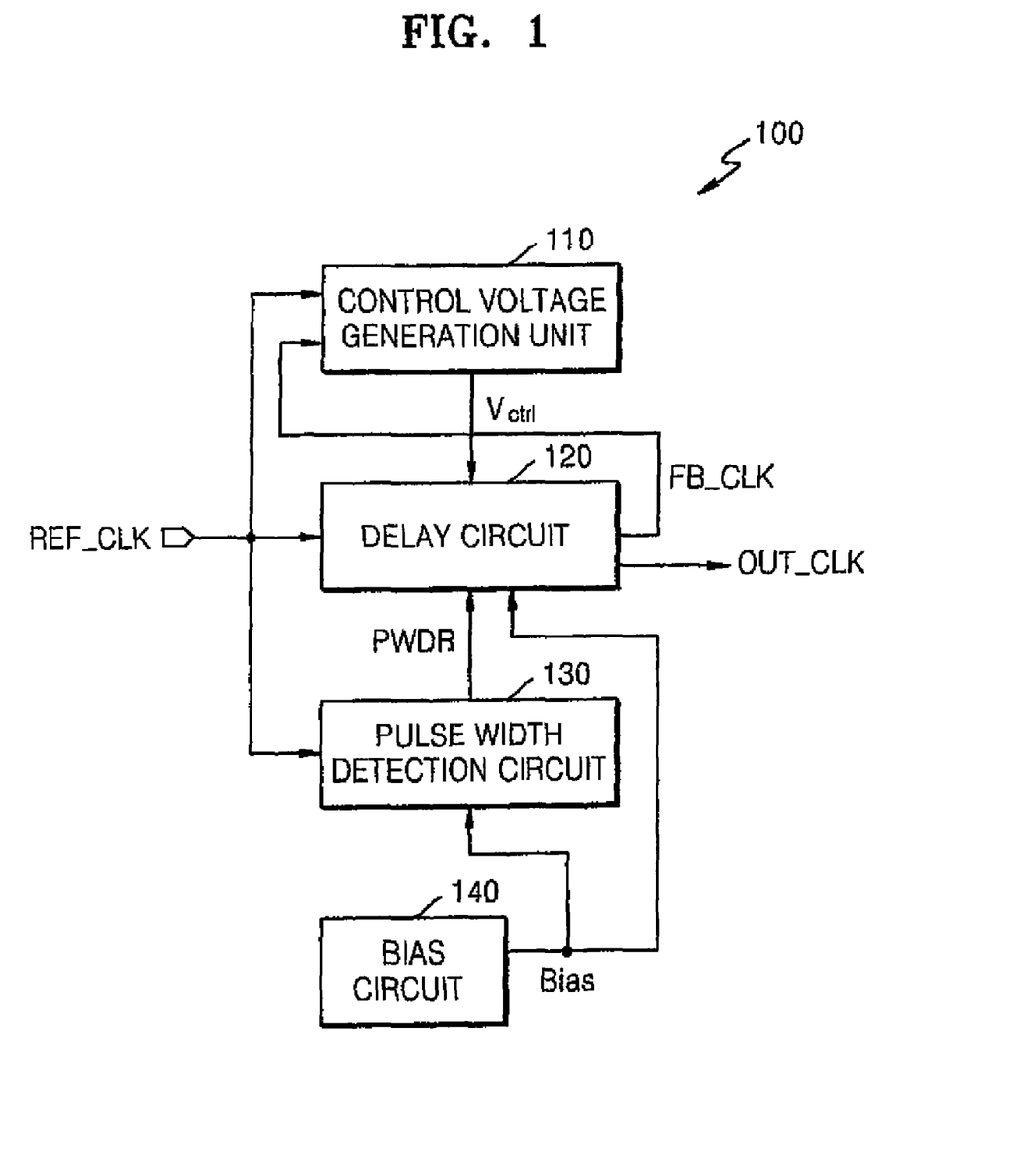
FIG. 1 is a block diagram of a delay locked loop (DLL), according to an embodiment of the inventive concept.

FIG. 1 is a block diagram of a delay locked loop (DLL) 100, according to an embodiment of the inventive concept. As illustrated in FIG. 1, the DLL 100 includes a control voltage generation unit 110, a delay circuit 120 and a pulse width detection circuit 130. The DLL 100 may further include a bias circuit 140.

Referring to FIG. 1, the control voltage generation unit 110 receives a reference clock signal REF_CLK, and receives a feedback clock signal FB_CLK from the delay circuit 120. The control voltage generation unit 110 compares the reference clock signal REF_CLK and the feedback clock signal FB_CLK, and generates and outputs a control voltage signal Vctrl.

The pulse width detection circuit 130 receives the reference clock signal REF_CLK, detects the pulse width of the reference clock signal REF_CLK, and outputs a pulse width detection result signal PWDR indicating the detecting result. The pulse width detection result signal PWDR may include at least one binary bit. The construction and operation of the pulse width detection circuit 130 according to an embodiment of the inventive concept will be further described below with reference to FIGS. 3 to 5.

Referring to FIG. 1, the delay circuit 120 receives the reference clock signal REF_CLK, and receives the pulse width detection result signal PWDR from the pulse width detection circuit 130. The delay circuit 120 may adjust a time delay in the reference clock signal REF_CLK in response to the pulse width detection result signal PWDR and output a clock signal OUT_CLK. That is, when the delay circuit 120 outputs the clock signal OUT_CLK, e.g., by delaying the reference clock signal REF_CLK, a time delay during which the reference clock signal REF_CLK is delayed is controlled according to the pulse width detection result signal PWDR. The output clock signal OUT_CLK output from the delay circuit 120 may be used as a sampling clock signal outside the DLL 100.

As illustrated in FIG. 1, the DLL 100 may further include a bias circuit 140. The bias circuit 140 generates a bias signal Bias according to process, voltage and temperature (PVT) variations, for example, and outputs the bias signal Bias to the pulse width detection circuit 130 and the delay circuit 120. The configuration of the bias circuit 140 would be apparent to one of ordinary skill in the art and thus will not be described herein.

Figure 2:
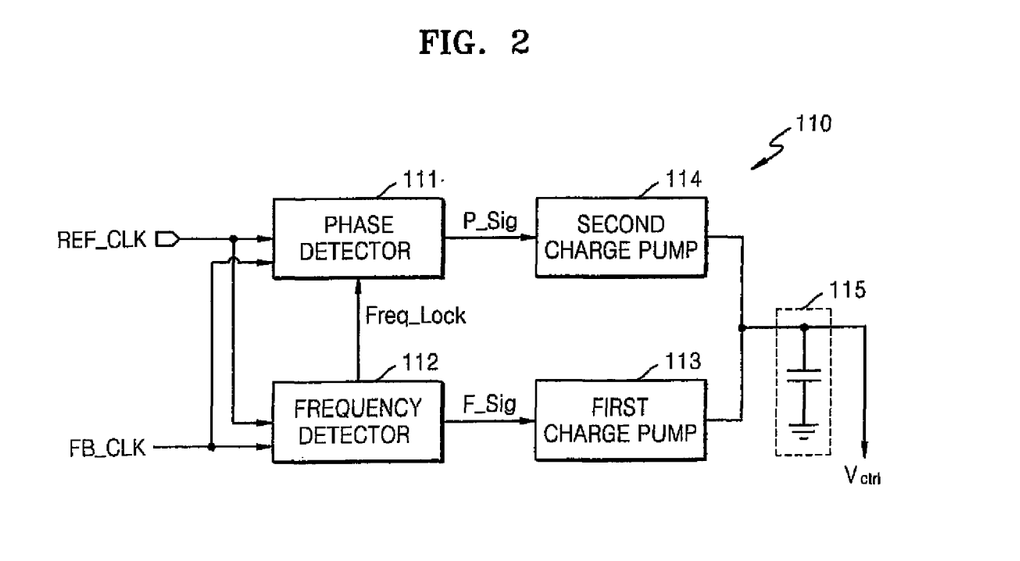
FIG. 2 is a block diagram of a control voltage generation unit included in the DLL of FIG. 1, according to an embodiment of the inventive concept.

FIG. 2 is a block diagram of the control voltage generation unit 110 included in the DLL 100 of FIG. 1, according to an embodiment of the inventive concept. Referring to FIG. 2, the control voltage generation unit 110 includes a phase detector 111, a frequency detector 112, a first charge pump 113, a second charge pump 114 and a loop filter 115.

The phase detector 111 receives the reference clock signal REF_CLK and the feedback clock signal FB_CLK, and receives a frequency-locked signal Freq_Lock from the frequency detector 112. The phase detector 111 compares the phase of the reference clock signal REF_CLK and the phase of the feedback clock signal FB_CLK. The phase detector 111 generates and outputs a phase detection signal P_Sig containing the comparison result to the second charge pump 114, in response to the frequency-locked signal Freq_Lock. The phase detection signal P_Sig may include a phase increase signal or a phase decrease signal.

The frequency detector 112 outputs the frequency-locked signal Freq_Lock to the phase detector 111, and outputs a frequency detection signal F_Sig to the first charge pump 113, in response to the reference clock signal REF_CLK and the feedback clock signal FB_CLK. The frequency detection signal F_Sig may include a frequency increase signal or a frequency decrease signal.

The first charge pump 113 and the second charge pump 114 output the control voltage signal Vctrl in response to the phase detection signal P_Sig and the frequency detection signal F_Sig, respectively. The control voltage signal Vctrl output from the first charge pump 113 and the second charge pump 114 is output from the control voltage generation unit 110 via the loop filter 115. The configurations of the phase detector 111, the frequency detector 112, the first charge pump 113, the second charge pump 114 and the loop filter 115 included in the control voltage generation unit 110 would be apparent to one of ordinary skill in the art and thus will not be described herein.

Figure 3A:
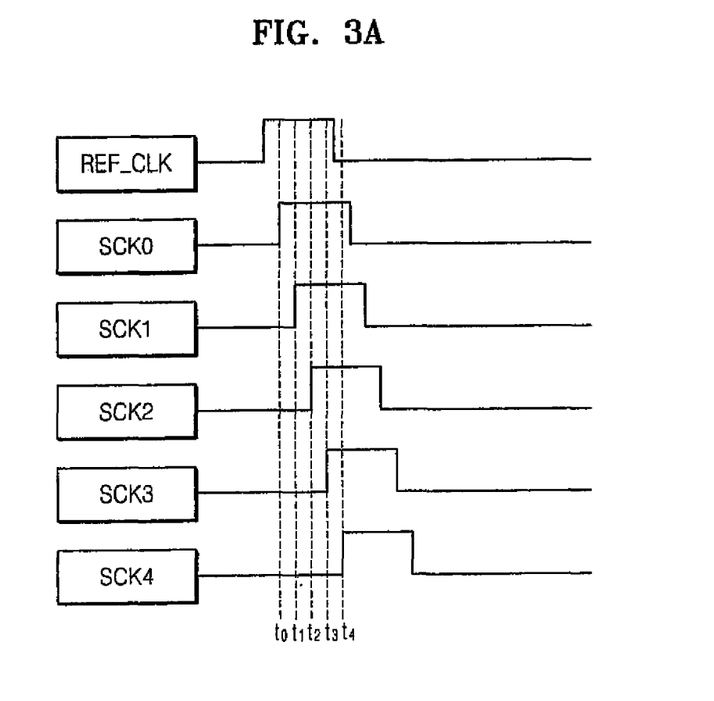
FIGS. 3A and 3B are timing diagrams illustrating operation of a pulse width detection circuit included in the DLL of FIG. 1, according to embodiments of the inventive concept.
Figure 3B:
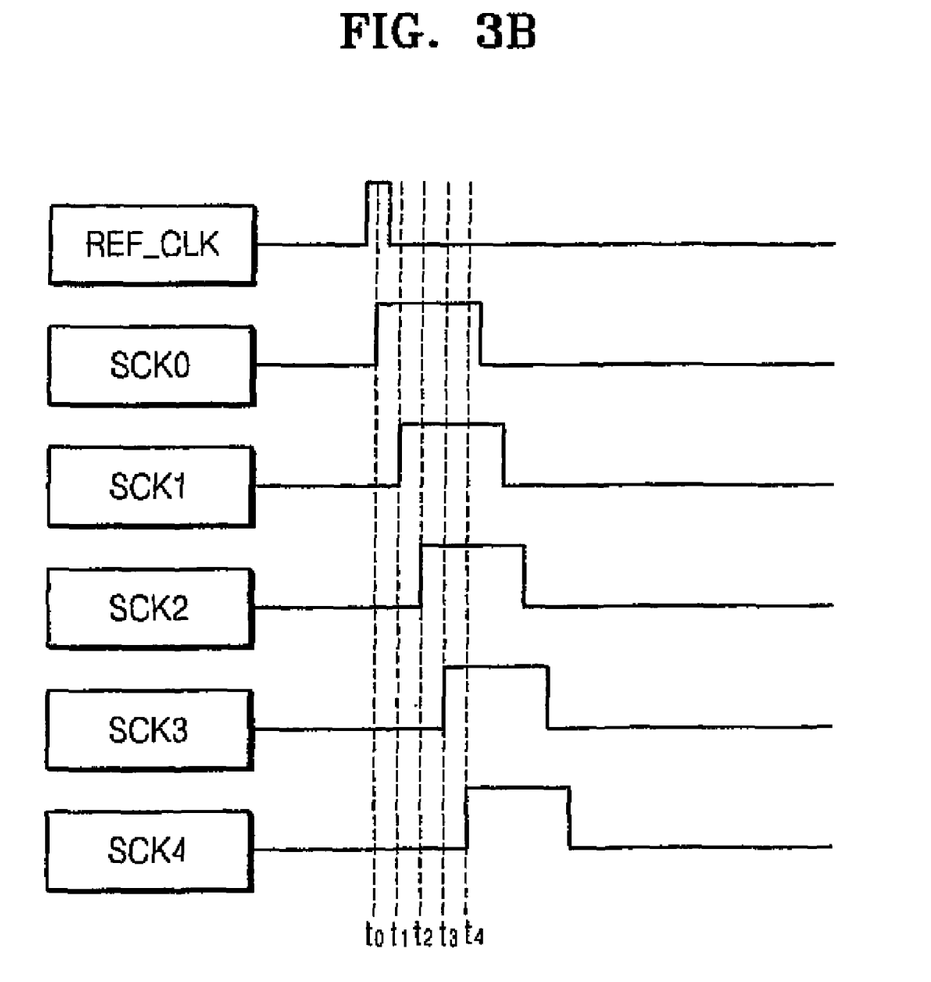

FIGS. 3A and 3B are timing diagrams illustrating a representative operation of the pulse width detection circuit 130 of FIG. 1, according to embodiments of the inventive concept. In the depicted operation, the pulse width detection circuit 130 receives reference clock signal REF_CLK, samples the reference clock signal REF_CLK multiple times using sampling clock signals SCK0, SCK1, SCK2, SCK3 and SCK4 having different time delays, and outputs a pulse width detection result signal PWDR containing the sampling results. Although FIGS. 3A and 3B illustrate that the reference clock signal REF_CLK is sampled several times using the five sampling clock signals SCK0, SCK1, SCK2, SCK3 and SCK4, the pulse width detection circuit 130 according to various embodiments of the inventive concept is not limited to this implementation, and the reference clock signal REF_CLK may be sampled in various ways.

Referring to FIGS. 3A and 3B, the differences between the time delays in the sampling clock signals SCK0, SCK1, SCK2, SCK3 and SCK4 may be the same. That is, as illustrated in FIGS. 3A and 3B, the sampling clock signals SCK0, SCK1, SCK2, SCK3 and SCK4 may be sequentially obtained by delaying the reference clock signal REF_CLK for predetermined times t0, t1, t2, t3 and t4, respectively. Referring to FIG. 3A, when the reference clock signal REF_CLK is sampled using the sampling clock signals SCK0, SCK1, SCK2, SCK3 and SCK4, the sampling result based on the sampling clock signal SCK0 is "1", the sampling result based on the sampling clock signal SCK1 is "1", the sampling result based on the sampling clock signal SCK2 is "1", the sampling result based on the sampling clock signal SCK3 is "1", and the sampling result based on the sampling clock signal SCK4 is "0". In this case, if the pulse width detection result signal PWDR is generated using the sampling result based on the sampling clock signal SCK4 as a most significant bit (MSB) and the sampling result based on the sampling clock signal SCK0 as a least significant bit (LSB) from among the multiple sampling results, for example, then the pulse width detection result signal PWDR may be expressed as "01111", which are binary bits. Here, "1" denotes logic high and "0" denotes logic low, for example. In this case, "01111" is just an example of the pulse width detection result signal PWDR, and thus the pulse width detection result signal PWDR may be expressed as various combinations of the above sampling results, or may include a different number of bits, without departing from the scope of the present teachings.

The pulse width of the reference clock signal REF_CLK illustrated in FIG. 3B is less than the pulse width of the reference clock signal REF_CLK illustrated in FIG. 3A. When the reference clock signal REF_CLK of FIG. 3B is sampled using the sampling clock signals SCK0, SCK1, SCK2, SCK3 and SCK4, the sampling result based on the sampling clock signal SCK0 is "1", the sampling result based on the sampling clock signal SCK1 is "0", the sampling result based on the sampling clock signal SCK2 is "0", the sampling result based on the sampling clock signal SCK3 is "0", and the sampling result based on the sampling clock signal SCK4 is "0". Thus, if the pulse width detection result signal PWDR is generated using the sampling result based on the sampling clock signal SCK4 as the MSB and the sampling result based on the sampling clock signal SCK0 as the LSB, as described above with reference to FIG. 3A, the pulse width detection result signal PWDR of FIG. 3B may be expressed as "00001".

As described above with reference to FIGS. 3A and 3B, the pulse width detection result signal PWDR may be obtained according to the pulse width of the reference clock signal REF_CLK. That is, the total number of "1s" in the pulse width detection result signal PWDR increases when the pulse width of the reference clock signal REF_CLK is relatively large, i.e., when the frequency of the reference clock signal REF_CLK is relatively low. Also, the total number of "0s" in the pulse width detection result signal PWDR increases when the pulse width of the reference clock signal REF_CLK is relatively small, i.e., when the frequency of the reference clock signal REF_CLK is relatively high. Accordingly, it is possible to measure the frequency and pulse width of the reference clock signal REF_CLK using the pulse width detection result signal PWDR. Since pulse width is inversely proportional to frequency, the pulse width detection result signal PWDR represents the frequency of the reference clock signal REF_CLK.

In various embodiments, the total number of the sampling clock signals SCK0, SCK1, SCK2, SCK3 and SCK4 and sampling intervals may be adjusted in order to adjust the range of frequencies that is to be measured and the intervals of frequencies that can be measured, without departing from the scope of the present teachings. That is, the more sampling clock signals, the wider the range of frequencies that can be measured, and the narrower the intervals of the sampling clock signals, the more precise the range of frequencies that can be measured.

Figure 4:
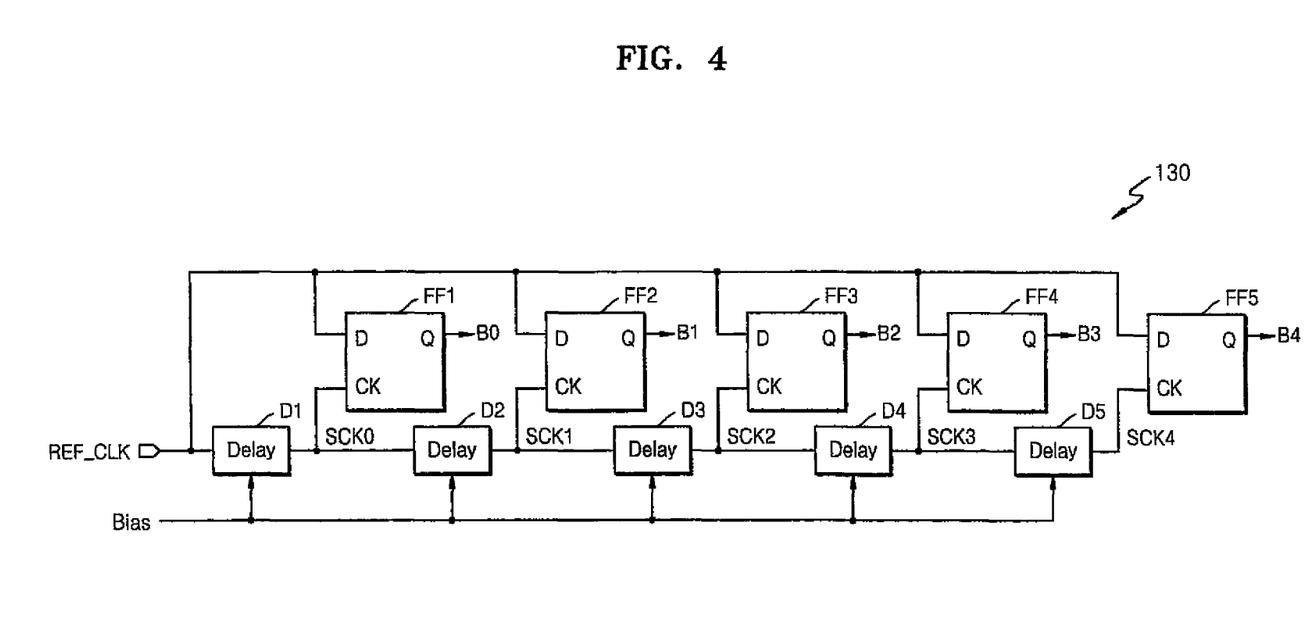
FIG. 4 is a block diagram of the pulse width detection circuit included in the DLL of FIG. 1, according to an embodiment of the inventive concept.

FIG. 4 is a circuit diagram of the pulse width detection circuit 130 included in the DLL 100 of FIG. 1, according to an embodiment of the inventive concept. Referring to FIG. 4, the pulse width detection circuit 130 includes at least one sampling unit, e.g., representative sampling units FF1, FF2, FF3, FF4 and FF5, and at least one delay cell, e.g., representative delay cells D1, D2, D3, D4 and D5. Although FIG. 4 illustrates that the pulse width detection circuit 130 includes five sampling units and five delay cells, the pulse width detection circuit 130 according to various embodiments of the inventive concept is not limited thereto, and may be configured in various alternative ways. For convenience of explanation, it is assumed that five sampling units and five delay cells are included in the pulse width detection circuit 130 as illustrated in FIG. 4.

The sampling units FF1, FF2, FF3, FF4 and FF5 receive the reference clock signal REF_CLK, receive sampling clock signals SCK0, SCK1, SCK2, SCK3 and SCK4, respectively, sample the reference clock signal REF_CLK in response to the sampling clock signals SCK0, SCK1, SCK2, SCK3 and SCK4, respectively, and output the sampling results. The sampling clock signals SCK0, SCK1, SCK2, SCK3 and SCK4 are obtained by delaying the reference clock signal REF_CLK by different time delays, as discussed above. As illustrated in FIG. 4, the sampling clock signal SCK0 is obtained by passing the reference clock signal REF_CLK through the delay cell D1, and the sampling clock signal SCK1 is obtained by passing the reference clock signal REF_CLK through the delay cells D1 and D2, and so on. Thus, the sampling clock signals SCK0, SCK1, SCK2, SCK3 and SCK4 have different time delays since they are sequentially obtained by passing the reference clock signal REF_CLK through the delay cell D1, the delay cells D1 and D2, the delay cells D1 to D3, the delay cells D1 to D4, and the delay cells D1 to D5, respectively. That the delay cells D1, D2, D3, D4 and D5 of FIG. 4 are connected in series is just illustrative, and it would be apparent to one of ordinary skill in the art that multiple sampling clock signals having different time delays may be obtained in various ways, without departing from the scope of the present teachings. The delay cells D1, D2, D3, D4 and D5 may be configured the same or differently from one another.

The sampling units FF1, FF2, FF3, FF4 and FF5 sample the reference clock signal REF_CLK in response to the sampling clock signals SCK0, SCK1, SCK2, SCK3 and SCK4, respectively, and output the sampling results as output signals B0, B1, B2, B3 and B4, respectively. The output signals B0, B1, B2, B3 and B4 of the sampling units FF1, FF2, FF3, FF4 and FF5, respectively, have a value of "1" or "0". The pulse width detection result signal PWDR may include one or more of the output signals B0, B1, B2, B3 and B4. For example, as described above with reference to FIGS. 3A and 3B, the pulse width detection result signal PWDR may be a combination of the output signals B0, B1, B2, B3 and B4 of the sampling units FF1, FF2, FF3, FF4 and FF5. The operation of the pulse width detection circuit 130 illustrated in FIG. 4 according to an embodiment of the inventive concept is as described above with reference to FIGS. 3A and 3B, and thus the description will not be repeated.

A bias signal Bias output from the bias circuit 140 of FIG. 1 may be supplied to the delay cells D1, D2, D3, D4 and D5. The delay cells D1, D2, D3, D4 and D5 may respectively compensate for a change in a time delay in the delay cells D1, D2, D3, D4 and D5 according to PVT variations, for example, in response to the bias signal Bias.

Figure 5:
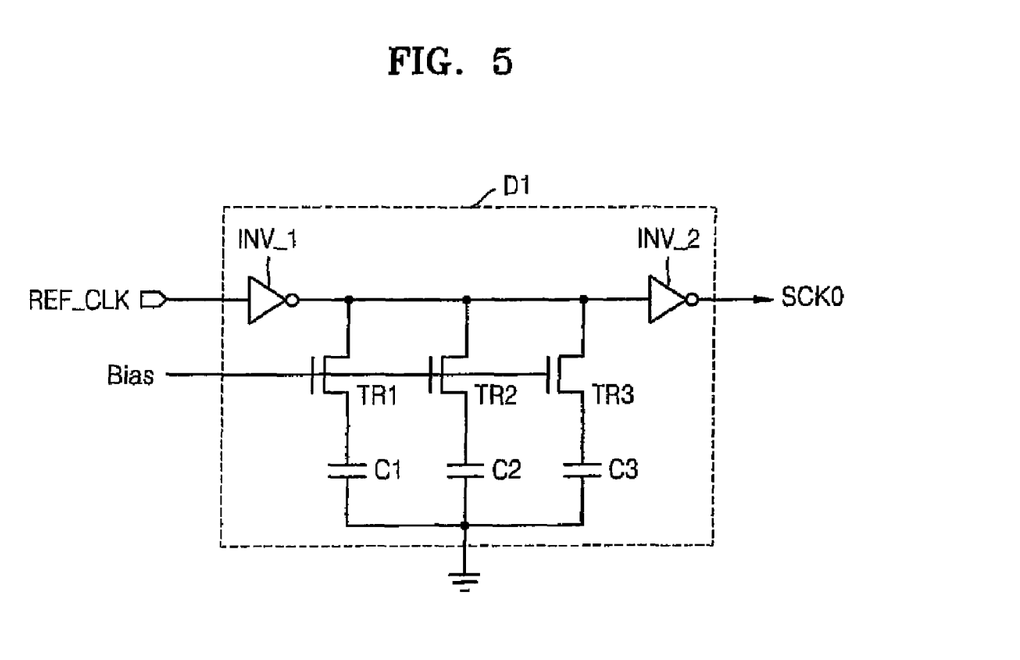
FIG. 5 is a circuit diagram of a delay cell included in the pulse width detection circuit illustrated in FIG. 4, according to an embodiment of the inventive concept.

FIG. 5 is a circuit diagram of the delay cell D1 included in the pulse width detection circuit 130 illustrated in FIG. 4, according to an embodiment of the inventive concept. The delay cell D1 may include at least one inverter, e.g., representative inverters INV_1 and INV_2, at least one transistor, e.g., representative transistors TR1, TR2 and TR3, and at least one capacitor, e.g., representative capacitors C1, C2 and C3. The inverters INV_1 and INV_2 are connected in series and delay a received reference clock signal REF_CLK. The inverter INV_2 outputs the delayed reference clock signal REF_CLK as a sampling clock signal SCK0. Whether the transistors TR1, TR2 and TR3 are to be switched on or off is determined in response to the bias signal Bias. That is, whether to connect an output node of the inverter INV_1 to the capacitors C1, C2 and/or C3 is determined according to the bias signal Bias, and thus a time delay in the delay cell D1 may be controlled according to the bias signal Bias. The other delay cells D2, D3, D4 and D5 illustrated in FIG. 4 may also have the same construction as the delay cell D1. The delay cell D1 illustrated in FIG. 5 is just an example, and may be constructed in various ways.

Figure 6:
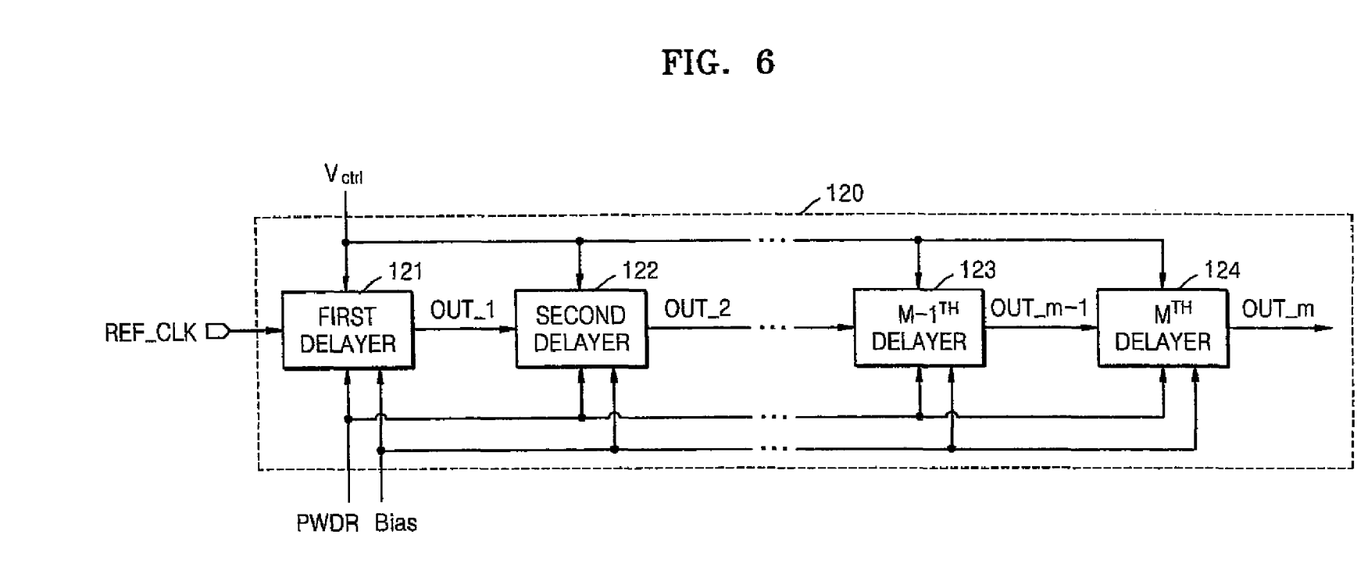
FIG. 6 is a block diagram of a delay circuit included in the DLL of FIG. 1, according to an embodiment of the inventive concept.

FIG. 6 is a circuit diagram of the delay circuit 120 included in the DLL 100 of FIG. 1, according to an embodiment of the inventive concept. The delay circuit 120 includes first through $m^{th}$ delayers 121, 122, 123 and 124. The first through $m^{th}$ delayers 121, 122, 123 and 124 may be connected to one another in series, for example. Here, m denotes a natural number equal to or greater than 2, and the pulse width detection result signal PWDR may be supplied to the first through $m^{th}$ delayers 121, 122, 123 and 124. The bias signal Bias may also be supplied to the first through $m^{th}$ delayers 121, 122, 123 and 124.

Referring to FIG. 6, the first delayer 121 receives the reference clock signal REF_CLK, the pulse width detection result signal PWDR, and the control voltage signal Vctrl, and determines a first time delay in response to the pulse width detection result signal PWDR and the control voltage signal Vctrl. The first delayer 121 delays the reference clock signal REF_CLK for the first time delay and outputs an output signal OUT_1. That is, the output signal OUT_1 of the first delayer 121 is obtained by delaying the reference clock signal REF_CLK for the first time delay.

The first delayer 121 may further receive the bias signal Bias from the bias circuit 140. The first delayer 121 may compensate for a change in the first time delay, e.g., caused by PVT variations, in response to the bias signal Bias.

The second delayer 122 receives the output signal OUT_1 of the first delayer 121, the pulse width detection result signal PWDR and the control voltage signal Vctrl, and determines a second time delay in response to the pulse width detection result signal PWDR and the control voltage signal Vctrl. The second delayer 122 delays the output signal OUT_1 for the second time delay and outputs an output signal OUT_2. That is, the output signal OUT_2 of the second delayer 122 is obtained by delaying the output signal OUT_1 of the first delayer 121 for the second time delay.

The second delayer 122 may further receive the bias signal Bias from the bias circuit 140. The second delayer 122 may compensate for a change in the second time delay, e.g., caused by PVT variations, in response to the bias signal Bias.

The third delayer (not shown) through the $m^{th}$ delayer 124 operate in the same or similar manner to the first delayer 121 and the second delayer 122, and thus the operations thereof will not be separately described.

Referring to FIGS. 1 and 6, the delay circuit 120 may output at least one of the output signals OUT_1, OUT_2, ..., OUT_m-1, OUT_m of the first delayer 121 through $m^{th}$ delayers 124 as the output clock signal OUT_CLK to the outside. The output clock signal OUT_CLK output from the delay circuit 120 may be used as a sampling clock signal outside the DLL 100. In addition, the output clock signal OUT_CLK may be used as the feedback clock signal FB_CLK provided to the control voltage generation unit 110, discussed above.

Figure 7:
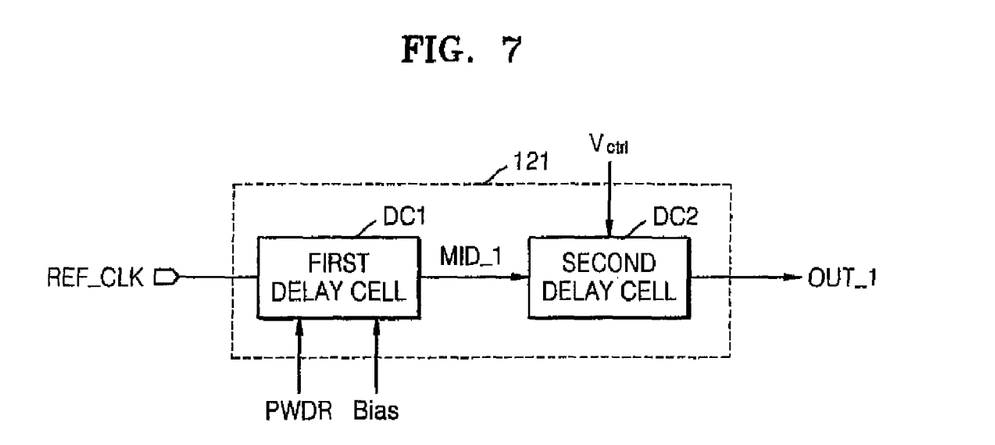
FIG. 7 is a block diagram of a first delayer included in the delay circuit of FIG. 6, according to an embodiment of the inventive concept.

FIG. 7 is a block diagram of the first delayer 121 included in the delay circuit 120 illustrated in FIG. 6, according to an embodiment of the inventive concept. The first delayer 121 includes a first delay cell DC1 and a second delay cell DC2, for example. The first delay cell DC1 receives the reference clock signal REF_CLK, delays the reference clock signal REF_CLK, and outputs the delayed reference clock signal REF_CLK as an output signal MID_. A time delay in the first delay cell DC1 may be controlled in response to the pulse width detection result signal PWDR. A bias signal Bias supplied to the first delay cell DC1 may be used to compensate for a change in the time delay in the first delay cell DC1, e.g., caused by PVT variations.

The second delay cell DC2 receives the output signal MID_1 of the first delay cell DC1, delays the output signal MID_1, and outputs the delayed output signal MID_1 as the output signal OUT_1. A time delay in the second delay cell DC2 may be controlled in response to the control voltage signal Vctrl received from the control voltage generation unit 110. In this case, the time delay in the first delay cell DC1 may be longer than that in the second delay cell DC2.

The second delayer 122 through the $m^{th}$ delayer 124 illustrated in FIG. 6 may have the same or similar construction as the first delayer 121 illustrated in FIG. 7, and thus the operations thereof will not be separately described.

Figure 8:
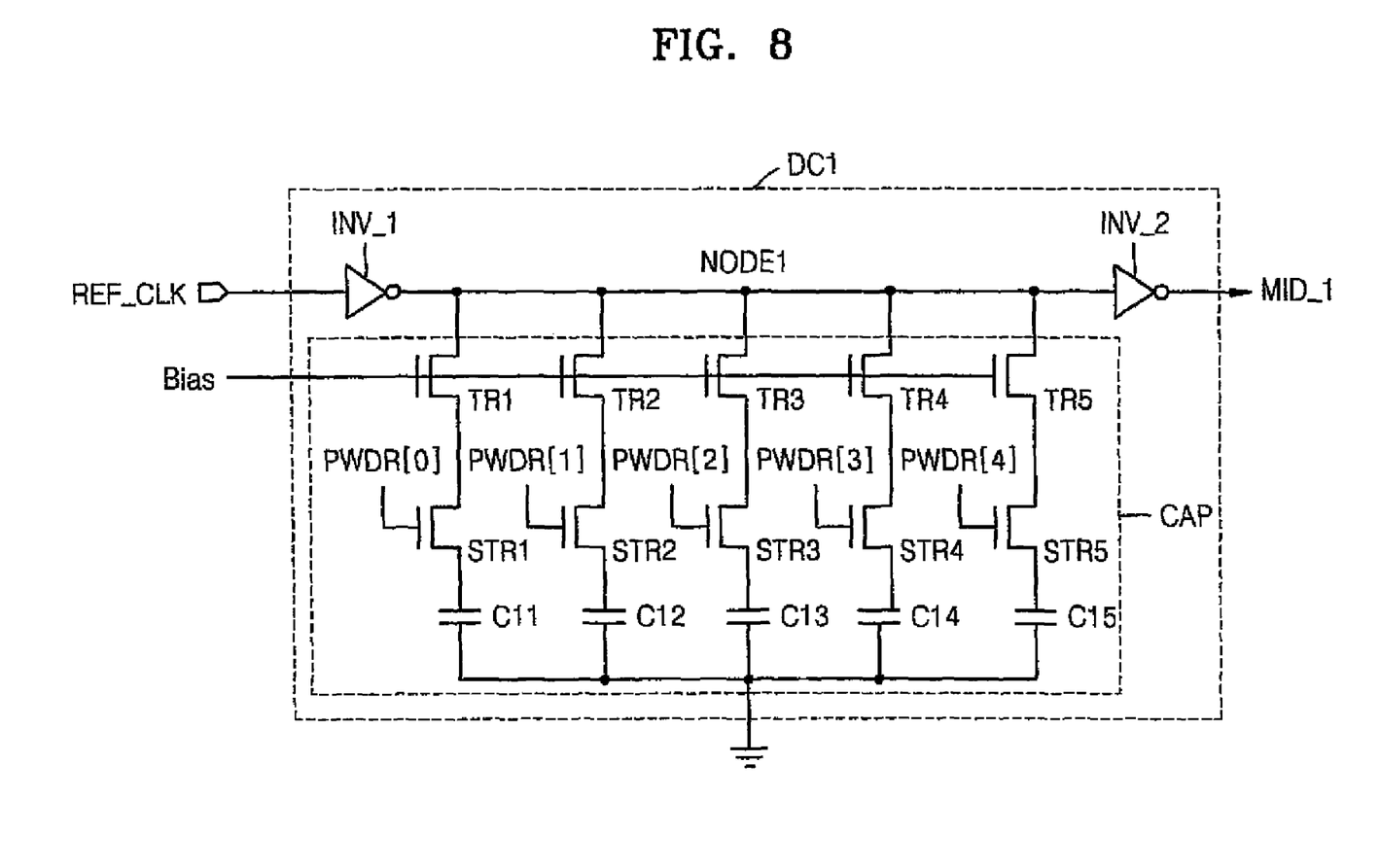
FIG. 8 is a circuit diagram of a first delay cell included in the first delayer of FIG. 7, according to an embodiment of the inventive concept.

FIG. 8 is a circuit diagram of the first delay cell DC1 illustrated in FIG. 7, according to an embodiment of the inventive concept. Referring to FIG. 8, the first delay cell DC1 may include a first inverter INV_1, a second inverter INV_2 and a capacitor unit CAP.

As illustrated in FIG. 8, the first inverter INV_1 receives and inverts the reference clock signal REF_CLK, and supplies the inversion result to a first node NODE1. The capacitor unit CAP is connected between the first node NODE1 and a ground voltage source. The capacitance of the capacitor unit CAP is controlled in response to the pulse width detection result signal PWDR. The second inverter INV_2 receives a signal from the first node NODE1, inverts the signal, and outputs the inverted result. A time delay in the first delay cell DC1 is controlled in response to the capacitance of the capacitor unit CAP.

Referring to FIG. 8, the capacitor unit CAP may includes multiple switch transistors STR1, STR2, STR3, STR4 and STR5, and multiple capacitors C11, C12, C13, C14 and C15. The capacitor unit CAP may further include multiple transistors TR1, TR2, TR3, TR4 and TR5 to which the bias signal Bias is supplied. Although FIG. 8 illustrates that the first delay cell includes five switch transistors STR1, STR2, STR3, STR4 and STR5, five capacitors C11, C12, C13, C14 and C15, and five transistors TR1, TR2, TR3, TR4 and TR5, the first delay cell DC1 according to various embodiments of the inventive concept is not limited thereto, and the first delay cell DC1 may be configured in various alternative ways. For convenience of explanation, it is assumed that five switch transistors, five capacitors and five transistors are included in the first delay cell DC1, as illustrated in FIG. 8.

Referring to FIG. 8, first terminals of the switch transistors STR1, STR2, STR3, STR4 and STR5 are connected to the first node NODE1, and second terminals of the switch transistors STR1, STR2, STR3, STR4 and STR5 may be connected to first terminals of the capacitors C11, C12, C13, C14 and C15, respectively. Bits PWDR[0], PWDR[1], PWDE[2], PWDR[3] and PWDR[4] of the pulse width detection result signal PWDR are supplied to gates of the switch transistors STR1, STR2, STR3, STR4 and STR5, respectively. Second terminals of the capacitors C11, C12, C13, C14 and C15 are connected to the ground voltage source. The transistors TR1, TR2, TR3, TR4 and TR5 to which the bias signal Bias is supplied are connected between the first node NODE1 and the first terminals of the switch transistors STR1, STR2, STR3, STR4 and STR5, respectively.

Referring to FIG. 8, an illustrative method of controlling the time delay in the first delay cell DC1 in response to the pulse width detection result signal PWDR will now be described in detail. First, it is assumed that the bias signal Bias is maintained at a constant level and the transistors TR1, TR2, TR3, TR4 and TR5 are turned on.

If the pulse width detection result signal PWDR is "01111", for example, then the bit PWDR[4], i.e., a low signal, is supplied to the gate of the switch transistor STR5, and the bits PWDR[0], PWDR[1], PWDR[2] and PWDR[3], i.e., high signals, are supplied to the gates of the switch transistors STR1, STR2, STR3 and STR4, respectively. Thus, the switch transistor STR5 is turned off and the switch transistors STR1, STR2, STR3 and STR4 are turned on. In this case, the capacitance of the capacitor unit CAP is equal to the sum of the values of the capacitors C11, C12, C13 and C14, which correspond to the switch transistors STR1, STR2, STR3 and STR4, respectively, which are turned on.

If the pulse width detection result signal PWDR is "00001", for example, the bit PWDR[0], i.e., a high signal, is supplied to the gate of the switch transistor STR1, and the bits PWDR[1], PWDR[2], PWDR[3] and PWDR[4], i.e., low signals, are supplied to the gates of the switch transistors STR2, STR3, STR4 and STR5, respectively. Thus, the switch transistor STR1 is turned on and the switch transistors STR2, STR3, STR4 and STR5 are turned off. In this case, the capacitance of the capacitor unit CAP is equal to the capacitance of the capacitor C11, which corresponds to the switch transistor STR1 that is turned on.

The capacitance of the capacitor unit CAP when the pulse width detection result signal PWDR is "01111" is greater than when the pulse width detection result signal PWDR is "00001". Thus, the time delay in the first delay cell DC1 when the pulse width detection result signal PWDR is "01111" is greater than when the pulse width detection result signal PWDR is "00001".

As described above with reference to FIGS. 3A and 3B, the total number of "1s" in the pulse width detection result signal PWDR increases when the pulse width of the reference clock signal REF_CLK is relatively large (when the frequency of the reference clock signal REF_CLK is relatively low), and the total number of "0s" in the pulse width detection result signal PWDR increases when the pulse width of the reference clock signal REF_CLK is relatively small (when the frequency of the reference clock signal REF_CLK is relatively high). The greater the total number of "1s" in the pulse width detection result signal PWDR, the more switch transistors are turned on from among the switch transistors STR1, STR2, STR3, STR4 and STR5 of FIG. 8, and the capacitance of the capacitor unit CAP increases. In other words, the greater the pulse width of the reference clock signal REF_CLK, the greater the total number of "1s" in the pulse width detection result signal PWDR, in which case, the capacitance of the capacitor unit CAP increases and the time delay in the first delay cell DC1 increases.

Consequently, the capacitance of the capacitor unit CAP is controlled according to the pulse width detection result signal PWDR, and the time delay in the first delay cell DC1 is controlled according to the capacitance of the capacitor unit CAP connected to the first node NODE1.

The bias signal Bias input to the first delay cell DC1 is supplied to the gates of the transistors TR1, TR2, TR3, TR4 and TR5 in order to compensate for a change in the time delay in the first delay cell DC1, e.g., which is =caused by PVT variations. The switch transistors STR1, STR2, STR3, STR4 and STR5 included in the first delay cell DC1 may be NMOS transistors, PMOS transistors or CMOS transistors, for example.

In various embodiments, the first delay cell DC1 illustrated in FIG. 8 and the delay cell D1 illustrated in FIG. 5 may be delay cells that operate in the same manner, so that time delays in the first delay cell DC1 and the delay cell D1 can be controlled in response to the pulse width detection result signal PWDR, which changes according to PVT variations.

Figure 9:
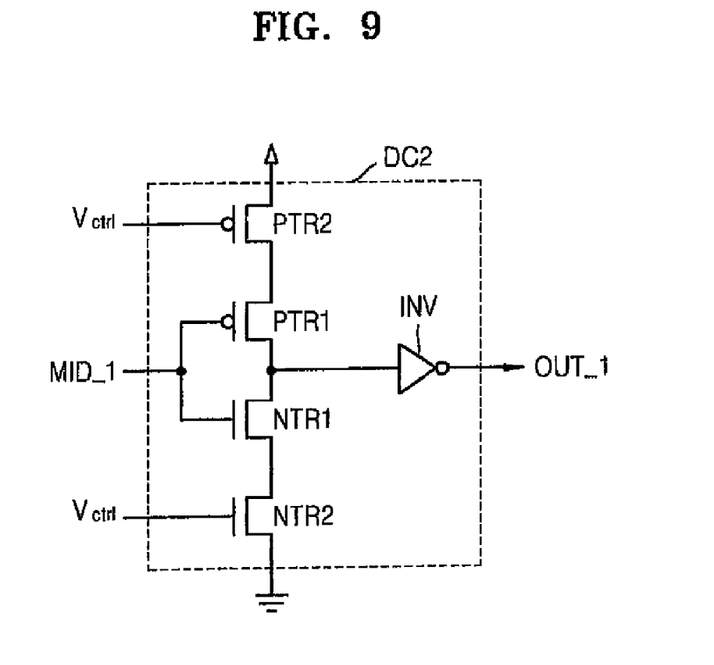
FIG. 9 is a circuit diagram of a second delay cell included in the first delayer of FIG. 7, according to an embodiment of the inventive concept.

FIG. 9 is a circuit diagram of the second delay cell DC2 included in the first delayer 121 of FIG. 7, according to an embodiment of the inventive concept. The second delay cell DC2 includes a first NMOS transistor NTR1, a second NMOS transistor NTR2, a first PMOS transistor PTR1, a second PMOS transistor PTR2 and an inverter INV. An output signal MID_1 of the first delay cell DC1 of FIG. 7 is supplied to the gates of the first NMOS transistor NTR1 and the first PMOS transistor PTR1, and the control voltage signal Vctrl output from the control voltage generation unit 110 may be supplied to the gates of the second NMOS transistor NTR2 and the second PMOS transistor PTR2. As illustrated in FIG. 9, the second PMOS transistor PTR2, the first PMOS transistor PTR1, the first NMOS transistor NTR1 and the second NMOS transistor NTR2 may be connected in series between a power supply voltage source and a ground voltage source, and an input terminal of the inverter INV may be connected between the first PMOS transistor PTR1 and the first NMOS transistor NTR1.

The output signal MID_1 of the first delay cell DC1 is delayed and output while sequentially passing through the first NMOS transistor NTR1, the first PMOS transistor PTR1 and the inverter INV. The time delay in the second delay cell DC2 may be controlled according to a control voltage signal Vctrl.

Figure 10:
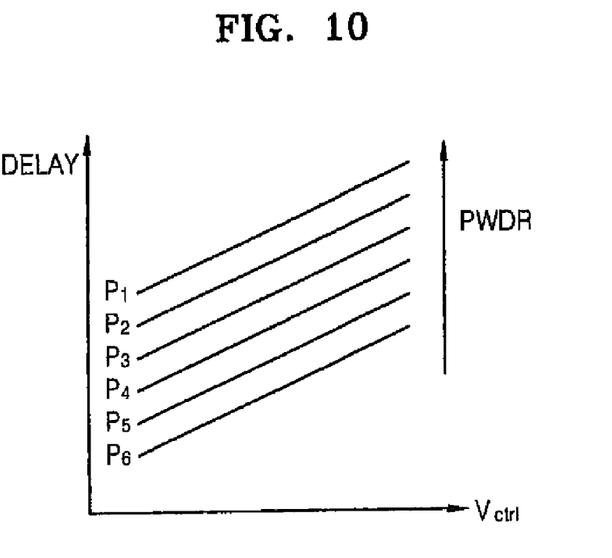
FIG. 10 is a graph illustrating relationships among a time delay in a delay circuit included in a DLL, a pulse width detection result signal and a control voltage signal, according to an embodiment of the inventive concept.

FIG. 10 is a graph illustrating relationships among a time delay in a delay circuit included in a DLL, a pulse width detection result signal PWDR, and a control voltage signal Vctrl, according to an embodiment of the inventive concept.

FIG. 10 illustrates an illustrative case in which the pulse width detection result signal PWDR is a five-bit signal, as described above with reference to FIGS. 4 and 8. However, the pulse width detection result signal PWDR is not limited to a five-bit signal, and may include a different number of bits, without departing from the scope of the present teachings.

In the graph of FIG. 10, plots P1, P2, P3, P4, P5 and P6 denote the relationships between a time delay in the delay circuit 120 of FIGS. 1 and 6 and the control voltage signal Vctrl, when the pulse width detection result signal PWDR is "11111", "01111", "00111", "00011", "00001" and "00000", respectively. That is, as the magnitude of the pulse width detection result signal PWDR becomes smaller, the frequency of a reference clock signal REF_CLK becomes higher, as shown by plot P1 to plot P6.

Referring to FIGS. 1 and 10, when the pulse width detection circuit 130 measures the pulse width of a reference clock signal REF_CLK, a plot is selected from among the plots P1 to P6 according to the pulse width of the reference clock signal REF_CLK, and then a time delay Delay in the delay circuit 120 is determined according to the control voltage signal Vctrl. The time delay Delay in FIG. 10 may denote the sum of time delays in the respective first through $m^{th}$ delayers 121, 122, ..., 123, 124 of FIG. 6 of the delay circuit 120. Alternatively, since the first through $m^{th}$ delayers 121, 122, ..., 123, 124 may have the same configuration, the time delay Delay in FIG. 10 may denote the time delay in each of the first through $m^{th}$ delayers 121, 122, ..., 123, 124.

The inclinations or slopes of the plots P1 to P6 and the distances between the plots P1 to P6 may be controlled, for example, by modifying the first through $m^{th}$ delayers 121, 122, ..., 123, 124 included in the delay circuit 120.

Figure 11:
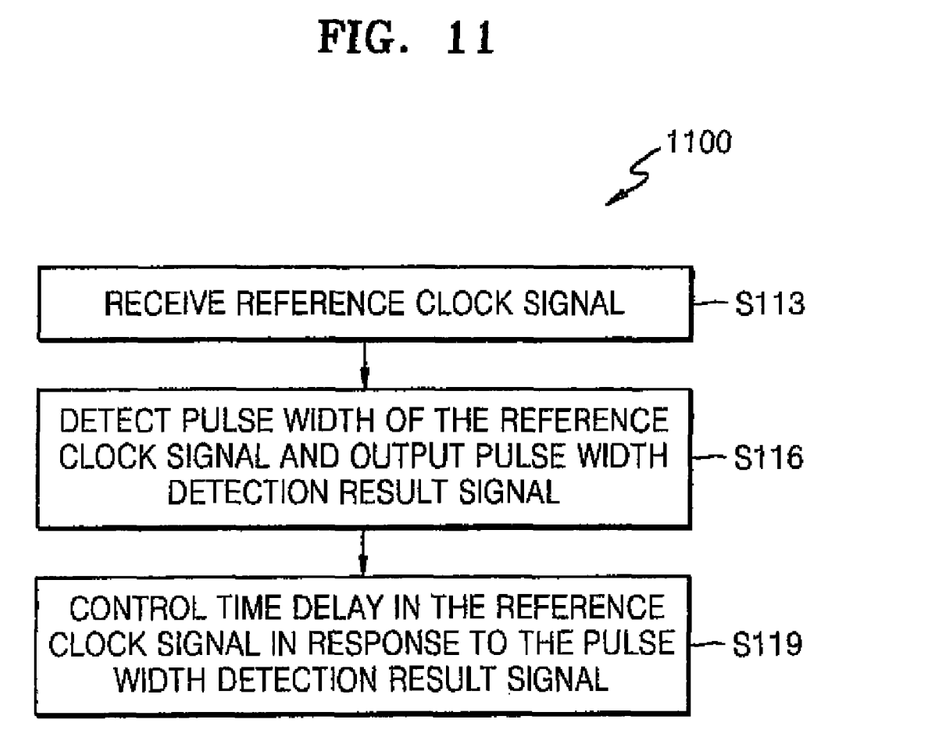
FIG. 11 is a flowchart illustrating a method of driving a DLL, according to an embodiment of the inventive concept.

FIG. 11 is a flowchart illustrating a method 1100 of driving a DLL, according to an embodiment of the inventive concept. The method 1100 includes operation S113 in which a reference clock signal is received, operation S116 in which the pulse width of the reference clock signal is detected and a pulse width detection result signal containing the detection result is output, and operation 5119 in which a time delay in the reference clock signal is controlled in response to the pulse width detection result signal. The method 1100 may further include an operation (not shown) in which the reference clock signal is delayed according to the time delay, and the delayed reference clock signal is output. The operations of method 1100 are described above in detail with reference to FIGS. 1 to 9, and will not be repeated.

While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A delay locked loop comprising:
a pulse width detection circuit receiving a reference clock signal, detecting pulse width of the reference clock signal, and outputting the detection result as a pulse width detection result signal; and
a delay circuit receiving and delaying the reference clock signal, and outputting the delayed reference clock signal as an output clock signal,
wherein the delay circuit receives the pulse width detection result signal from the pulse width detection circuit, and controls a time delay in the reference clock signal in response to the pulse width detection result signal, and
wherein the pulse width detection circuit samples the reference clock signal a plurality of times using a plurality of sampling clock signals having different time delays, and outputs at least one of the sampling results as the pulse width detection result signal.

2. A delay locked loop comprising:
a pulse width detection circuit receiving a reference clock signal, detecting pulse width of the reference clock signal, and outputting the detection result as a pulse width detection result signal; and
a delay circuit receiving and delaying the reference clock signal, and outputting the delayed reference clock signal as an output clock signal,
wherein the delay circuit receives the pulse width detection result signal from the pulse width detection circuit, and controls a time delay in the reference clock signal in response to the pulse width detection result signal,
wherein the pulse width detection circuit comprises at least one sampling unit receiving the reference clock signal and a plurality of sampling clock signals, sampling the reference clock signal according to the respective sampling clock signals, and outputting the sampling results,
wherein the sampling clock signals received by the at least one sampling unit are obtained by delaying the reference clock signal according to different time delays, and
wherein the pulse width detection circuit outputs at least one of the output sampling results of the at least one sampling unit as the pulse width detection result signal.

3. The delay locked loop of claim 1, wherein the delay circuit comprises first through $m^{th}$ delayers that are connected in series, wherein m is a natural number equal to or greater than 2,
wherein the first delayer receives the reference clock signal and the pulse width detection result signal, determines a first time delay in response to the pulse width detection result signal, delays the reference clock signal for the first time delay, and outputs the delayed result, and
wherein the $m^{th}$ delayer receives an output of the $m-1^{th}$ delayer and the pulse width detection result signal, determines an $m^{th}$ time delay in response to the pulse width detection result signal, delays the output of the $m-1^{th}$ delayer for the $m^{th}$ time delay, and outputs the delayed result.

4. The delay locked loop of claim 3, wherein each of the first through $m^{th}$ delayers comprises a first delay cell receiving the pulse width detection result signal, a time delay in the first delay cell being controlled in response to the pulse width detection result signal, the first delay cell comprising:
a first inverter inverting a received signal and outputting the inversion result to a first node;
a capacitor unit connected between the first node and a ground voltage source, and having a capacitance controlled according to the pulse width detection result signal; and
a second inverter inverting a signal received from the first node and outputting the inversion result.

5. The delay locked loop of claim 4, further comprising:
a control voltage generation unit receiving the reference clock signal, receiving a feedback clock signal from the delay circuit, and generating a control voltage signal according to the reference clock signal and the feedback clock signal,
wherein each of the first through $m^{th}$ delayers further comprises a second delay cell receiving the control voltage signal from the control voltage generation unit, a time delay in the second delay cell being controlled in response to the control voltage signal.

6. The delay locked loop of claim 5, wherein the time delay in the first delay cell is longer than the time delay in the second delay cell.

7. A delay locked loop comprising:
- a pulse width detection circuit receiving a reference clock signal, detecting pulse width of the reference clock signal, and outputting the detection result as a pulse width detection result signal; and
- a delay circuit receiving and delaying the reference clock signal, and outputting the delayed reference clock signal as an output clock signal,
- wherein the delay circuit receives the pulse width detection result signal from the pulse width detection circuit, and controls a time delay in the reference clock signal in response to the pulse width detection result signal,
- a bias circuit generating a bias signal according to process, voltage and temperature (PVT) variations, and supplying the bias signal to the pulse width detection circuit and the delay circuit.

8. A method of driving a delay locked loop, the method comprising:
- receiving a reference clock signal;
- detecting a pulse width of the reference clock signal, and outputting a pulse width detection result signal; and
- delaying the reference clock signal and outputting the delayed reference clock signal,
- wherein delaying of the reference clock signal and outputting of the delayed reference clock signal comprises receiving the pulse width detection result signal and controlling a time delay for the reference clock signal in response to the pulse width detection result signal, and
- wherein the detecting the pulse width includes sampling the reference clock signal a plurality of times using a plurality of sampling clock signals having different time delays, and wherein at least one of the sampling results is output as the pulse width detection result signal.

* * * * *